United States Patent [19]
Rowlette, Sr.

[11] Patent Number: 5,163,837
[45] Date of Patent: Nov. 17, 1992

[54] ORDERED AREA ARRAY CONNECTOR

[75] Inventor: John R. Rowlette, Sr., Clemmons, N.C.

[73] Assignee: AMP Incorporated, Harrisburg, Pa.

[21] Appl. No.: 721,055

[22] Filed: Jun. 26, 1991

[51] Int. Cl.[5] .............................................. H01R 9/09
[52] U.S. Cl. ........................................ 439/91; 29/884; 439/331; 439/591
[58] Field of Search ................... 439/66, 74, 91, 591, 439/331; 29/876, 877, 883, 885, 845, 884

[56] References Cited

U.S. PATENT DOCUMENTS

| | | | |
|---|---|---|---|
| 3,541,222 | 11/1970 | Parks et al. | 439/66 |
| 3,880,486 | 4/1975 | Avakian | 439/82 |
| 4,050,756 | 9/1977 | Moore | 29/845 |
| 4,729,809 | 3/1988 | Dery et al. | 156/306.6 |
| 4,922,376 | 5/1990 | Pommer et al. | 29/845 |
| 4,991,290 | 2/1991 | McKay | 29/884 |

*Primary Examiner*—Neil Abrams

[57] ABSTRACT

A connector assembly (10) and a method of manufacture include a connector sheet (30) formed of a fine web of insulating strands (32, 34) woven together to define a mesh of cavities (35) containing discrete contacts (36, 40) held by an adhesive (38) to define an ordered anisotropic area of discrete contact points useful in interconnecting contact pads (24) of a component (20) to contact pads (18) of a circuit (12). A connector housing (60) is provided to clamp the component (20) to the circuit (12) with the connector sheet (30) therebetween.

7 Claims, 4 Drawing Sheets

ORDERED AREA ARRAY CONNECTOR

This invention relates to an electrical connector and a method of manufacture utilizing a sheet of flexible insulation material having an ordered mesh containing discrete contacts operable to interconnect contact paths between components and circuits.

BACKGROUND OF THE INVENTION

The ever decreasing size of electronic components, such as integrated circuits, and the associated reduction in center line spacings of contacts of the components and of the circuits on which they are mounted raises substantial difficulties in the manufacture of connectors. It does because the traditional tolerances in metal and plastic parts for connectors, expressed in several thousandths of an inch, are now being achieved in the components and circuits themselves in terms of conductive path widths and spacings.

Because of this, a number of approaches have been taken which employ very small conductive particles held in a matrix of insulating material including adhesives. These materials are variously whisker-like particles, or slivers, or platelets and flakes which are either fabricated of precious metals or of inert ingredients coated with precious metals. These various elements can range in size from ten to twenty microns in width or diameter up to 25 or 30 microns in maximum dimension. The elements are held in various binders, including pressure sensitive or hot melt and polymerizable adhesives and in elastomeric materials. The resulting product may be termed to be a conductive elastomer or a conductive adhesive, and both operate to interconnect the conductive paths of components to the conductive paths of circuits when such elements are forced together against the conductive element. The forcing together forces the conductive particles to touch each other and to contact the paths being interconnected to form electrical interconnections. U.S. Pat. No. 4,729,809, granted Mar. 8, 1988, is drawn to anisotropically conductive adhesive composition and details a conductive adhesive composition which is, in essence conductive in one direction. It mentions that the conductive particles have a tendency to form clusters during the mixing of the composition and also that larger particles may be employed, which are of a sufficient size to provide single particles conduction through an adhesive layer which is on the order in thickness of the diameter of the particles.

The foregoing patent and numerous other patents and teachings relating to conductive elastomers and/or adhesives employ a random placement of conductive particles in an insulating medium and depend upon the mixture of the composition to result in their being at least sufficient particles to form an interconnection when the composition is compressed between conductive paths. This randomness causes no particular problems when the areas of the conductive paths to be joined are relatively large compared to the size and number of particles and the spacing thereof, making the provision of particles statistically such as to assure interconnection.

But as the dimensions between conductive paths to be interconnected shrink, the statistically based random disposition of particles can become less reliable. Moreover, the randomness almost assures discrepancies as between contact paths manifest in variations in conductivity or resistivity and occasionally, variations in capacitive and inductive effects of the differently dimensioned conductive pathways based on the orientation, number, and disposition of not only the conductive particles, but of the insulating medium and thus the dielectric values of the interconnection.

Another problem facing the foregoing connection devices and techniques relates to the dependence upon the characteristics of adhesion which are directly related to the chemistry of the adhesive, its mixture and handling, shelf life, and relative volatilization.

Accordingly, the present invention has as an object the provision of an electrical connector and a method of manufacture which features an ordered disposition of fine conductive particles in a preformed sheet of insulating and dielectric material to provide an array of discrete contact elements, each essentially identical to the other in electrical and mechanical characteristics. The invention has as a further object the provision of a sheet of thin insulating material containing fine conductive particles forming an area array connector for interconnecting contact paths on very close centers and with very small spacing of paths between components and circuits. Still a further object is to provide a method of manufacturing ordered electrical connectors having discrete contacts on very fine centers. The invention further contemplates an objective of providing a thin film-like ordered array of conductive particles wherein the particles and the insulating matrix can be preformed and assembled together utilizing adhesive substances for mechanical purposes.

SUMMARY OF THE INVENTION

The present invention connector and method relate to the use of a plastic sheet which, in a preferred embodiment, is defined by a fine web of insulating strands woven together to define a mesh made to contain conductive contacts held by an adhesive in the mesh. The resulting structure is an ordered anisotropic conductive medium which may be manufactured on a continuous basis and cut into areas which interconnect the multiple paths of components such as integrated circuits and circuits such as printed circuits, all compressed together by a housing or the equivalent. The invention alternatively contemplates a molded sheet having holes or apertures defining the mesh with the conductive particles forced in such holes to define a single layer of insulation and contact elements which is on the order of the thickness of the diameter of the conductive elements. In accordance with the invention concept, contact elements on the order of 50 microns in diameter may be employed with a sheet of similar dimension and thickness utilizing an adhesive to hold the contacts in position within the sheet. In the woven variety of the invention, the warp and woof of the woven strands is such as to define a mesh receiving the contact elements.

The invention method contemplates displacement of a sheet of insulating material, a spraying of the sheet with adhesive followed by an air jet removal of excess adhesive, a flooding of the adhesive coated sheet with contact elements with a suitable doctoring to load the sheet to a single thickness of contact elements and a curing of the adhesive to hold the contact elements in place. The sheet following curing can be cut into suitable lengths to form connectors.

The invention contemplates contact elements formed of metal or glass spheres coated with appropriate finishes such as gold over nickel as well as spheres formed of conductive gel and/or discrete metallic spring elements. In one embodiment utilized for area array interconnection of components to circuits, a housing is provided for the component and the invention connector sheet operable to press the component against the sheet and in turn press the sheet against the circuit to be interconnected with the contact elements providing the electrical path between the conductive paths of component and circuit. By virtue of the ordered arrangement of contact elements, electrical parameters can be calculated and relied upon from contact to contact and connector to connector, both in term of numbers of contacts, and the physical dimensions of plastic and metal elements.

IN THE DRAWINGS

DETAILED DESCRIPTION OF THE INVENTION

Figure 1:
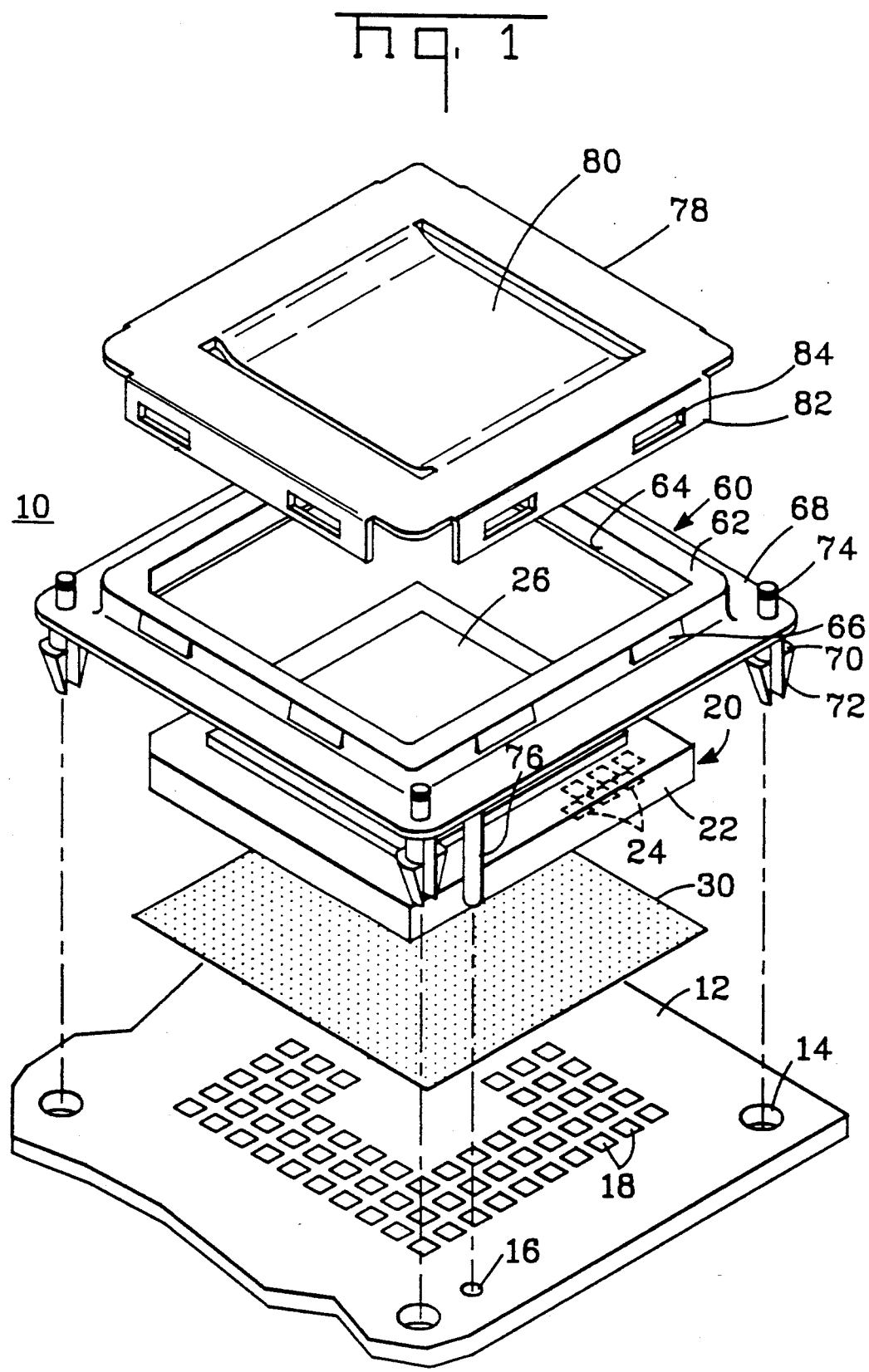
FIG. 1 is an exploded perspective view of an assembly of circuit, connector, sheet, component, and a connector housing operable to hold, position, and interconnect the various elements.
Figure 2:
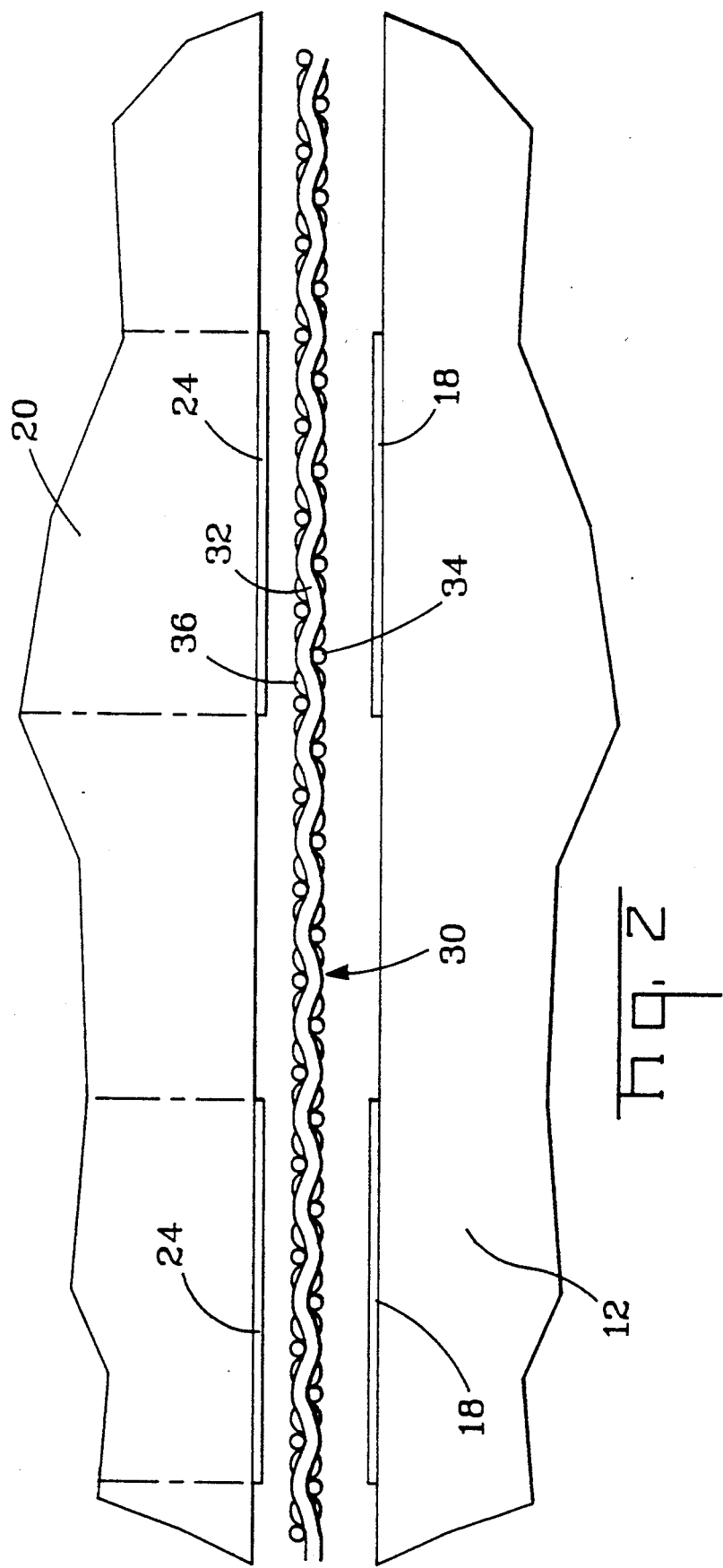
FIG. 2 is an elevational view, substantially enlarged, of the contact paths of a component and a circuit prior to interconnection with the sheet connector of the invention.
Figure 3:
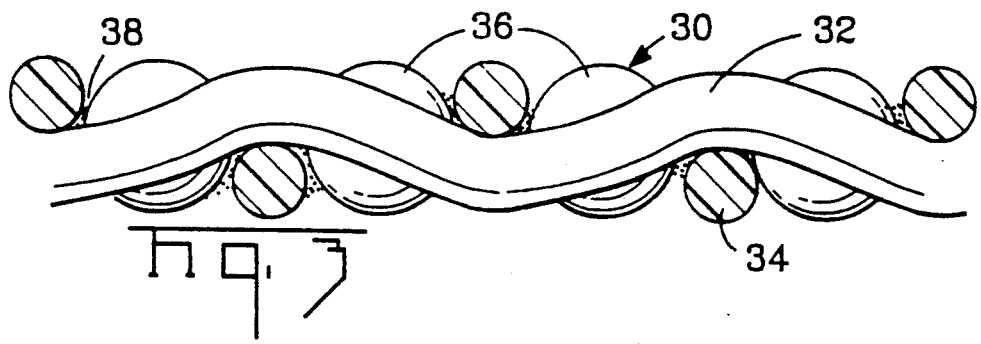
FIG. 3 is an elevational view, in partial section, of the connector shown in FIG. 2.
Figure 4:
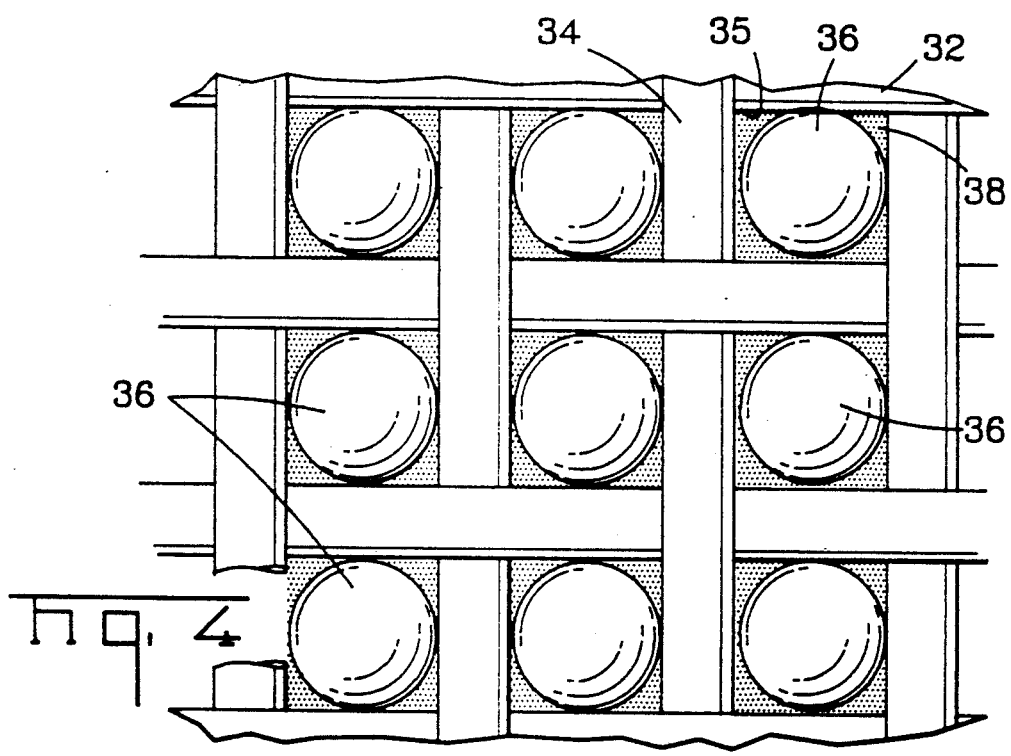
FIG. 4 is a plan view of the connector shown in FIG. 3.

Referring now to FIG. 1, an assembly 10 is shown to include a circuit 12, a component 20, a sheet connector 30, and a housing 60 which fit together to provide an electrical and mechanical interconnection of component to circuit. The circuit 12 may be considered to be a printed circuit board having a number of layers of conductive paths defining a functioning circuit and interconnecting various components to provide electronic functions, memory and logic. These elements in turn may be utilized to form computers, business machines, communication systems and the like. The circuit 12 includes a series of surface-mounted contact pads 18 arranged in an array on the surface thereof corresponding with contact pads on component 20 shown as 24 mounted on the undersurface of the body of the component shown as 22. The pads 18 interconnect to the various circuits within circuit 12. The circuit 12 includes at the periphery mounting holes 14 which facilitate the mounting of the connector housing 60 in a manner to be described. Also included in circuit 12 are guide and alignment holes 16, one of which is shown, which serve to align the connector housing 60 and the component and connector contained therewithin. The component 20 may be thought of as an integrated circuit, a hybrid, or other functioning device which contains therewithin arrays of solid state components interconnected by the pads 24 in the body 22 of the component. A flat metal plate, forming a heat sink 26, is attached to the upper surface of component 20. The sheet connector 30, shown in FIGS. 1 and 2, includes a series of discrete contacts 36 distributed in an ordered fashion over the surface of 30. FIGS. 2-4 show, in enlarged detail, the contacts 36 in the ordered arrangement in a matrix formed in the embodiment of FIGS. 3 and 4 of a plurality of strands of insulating material woven into warp and woof strands 32 and 34 to define a mesh of cavities 35 into which are fitted the contacts 36. Shown also in FIGS. 3 and 4 is an adhesive 38 which holds the contacts 36 in position within the mesh and also holds the web forming the sheet together. As can be seen in FIGS. 3 and 4, the contacts 36 essentially fill the mesh and are of a diameter and dimension approximating that of the sheet formed by strands 32 and 34.

Connector sheet 30 thus formed has an area corresponding to the area of the contact pads 18 of circuit 12 and contact pads 24 of component 20 and as can be discerned, contains contacts 36 on centers of ordered or fixed spacing so that numerous contacts 36 will engage a given pad 18 or pad 24 to provide for a redundancy of interface for electrical connection. The connector sheet 30 is fitted within the housing 60 along with component 20.

Referring to FIG. 1, housing 60 includes an upstanding or vertical flange 62 defining interiorly a cavity 64 into which the component 20 and the connector sheet 30 are fitted. On the exterior vertical surface of the flange 62 are latch projections 66 extending around the four sides thereof. At the corners of the housing 60 are fasteners 70 which include beveled downwardly projecting portions 72 which fit into holes 14 of the circuit 12. Connected to and integral with the portions 72 are projections 74 which extend above the flange 68. A cap 78 is provided, including a center projecting portion 80 which is flat and intended to bear against the heat sink plate 26 of component 20. The center portion 80 is relieved at the edges to provide a limited spring action for improving compliance in application of forces to component 20. On the exterior of cap 78 are downwardly projecting flanges 82 which include apertures 84 intended to be engaged by latches 66 when the assembly is put together. In practice, the component 20 and connector sheet 30 are put together within housing 60 with the housing then guided onto the circuit 12, alignment pins 76, one of which is shown at one corner of the housing, fit into alignment holes 16 and align the connector, component, and housing with the circuit 12. Thereafter, the housing is forced downwardly by the application of the cap which serves to drive the posts 74 downwardly, driving the fasteners 72 within holes 14, such fasteners deforming inwardly in a radial sense to snap outwardly and latch the housing to the circuit. Further downward movement of cap 78 will result in the latches 66 engaging apertures 84 to latch the assembly together and to force the component downwardly bearing against the connector 30. FIG. 2 shows the connector 30 disposed between the pads 18 and 24 carried by the circuit and component, respectively, prior to closure of the component and circuit together. As can be discerned from FIG. 2, numerous contacts 36 will engage the pads 18 and 24 upon closure.

In a prototype embodiment wherein the contacts 36 were on the order of 70 microns in diameter, the overall thickness of the sheet from the connector 30 was on the order of 70 microns with the strands on the order of 30 microns in diameter. The invention contemplates the use of thicker strands and a greater mesh dimension as well as smaller strands and a smaller mesh dimension. The invention contemplates, for example, contacts on the order of 50 to 100 microns being used with a sheet having a mesh of similar dimension and strands on the order of 20 to 30 microns. The strands 32 and 34 may be made of a polyester fiber woven into the configuration shown. The invention also contemplates that the sheet forming connector 30 may be molded, thermoformed, extruded, or stamped and formed to have a mesh like that shown in FIGS. 3 and 4 with the contacts 36 inserted in the mesh thereformed.

Figure 5:
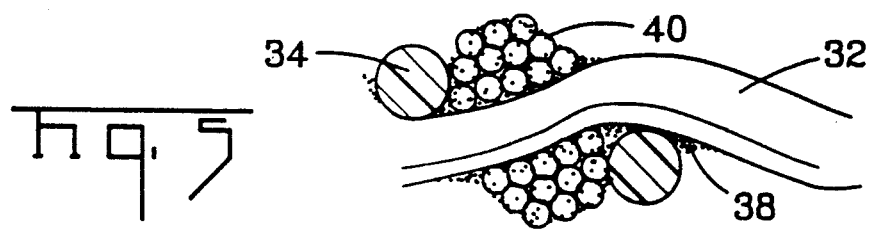
FIG. 5 is an elevational view, in partial section, of an alternative embodiment of contact element.

The invention contemplates a variety of contact constructions, including solid brass spheres, suitably nickel and gold plated, to maintain a reduced bulk resistance and an enhanced contact surface. Alternatively, glass or other inert and insulating spheres or other shapes, suitably plated with conductive material, may be employed. FIG. 5 shows another alternative in the form of a "fuzz button" fabricated by fine wire formed into a sphere-like volume and inserted in the mesh of the sheet material. The contact 40 would provide a discrete resilience and compression to effect a multi-point contact with the pads 18 and 34. The invention also contemplates fabricating the contacts 36 out of spheres or other volumetric shapes utilizing a conductive gel to form the body of the contact. Conductive gels are taught in U.S. Pat. No. 4,770,641, granted Sep. 13, 1988. There, the gel should be sufficiently cured to be handled as a discrete body.

As can be discerned from the dimensions above given, the resulting connector provides an interconnection which is very short in terms of electrical resistance and physical dimension, very short in terms of the dielectric path, and one in which discrete contacts having discrete resistances and discrete dielectric properties may be employed.

Figure 6:
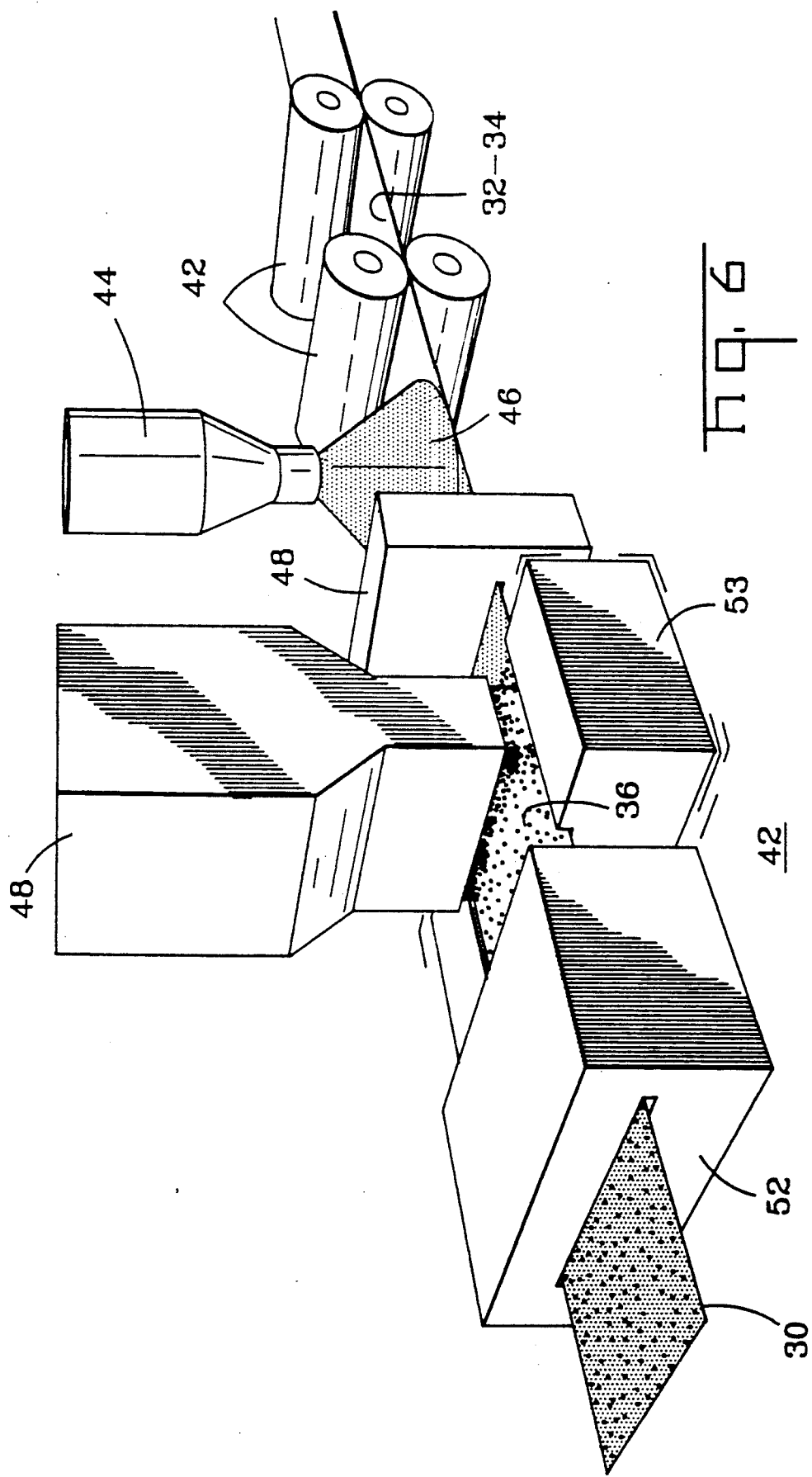
FIG. 6 is a schematic view of a preferred embodiment of the method of the invention.

Referring now to FIG. 6, a method for fabricating or manufacturing the invention is shown. The sheet forming connector 30, comprised of woven strands 32, 34 is guided by rollers 42, pulled by rollers similar to 42 but not shown to the left of the view in FIG. 6. Adjacent to rollers 42 is a nozzle 44 adapted to spray the strands with an adhesive to fill the mesh with such adhesive. Adjacent nozzle 44 is a drying and precure station 46 which precures the adhesive partially. An air jet may be provided to remove excess adhesive, leaving a film deposited within the mesh of the sheet. Adjacent to precure 46 is a station including a source of contacts and a vibrator 50 carrying the adhesive-coated sheet. The contacts 36 are flowed onto the sheet to fill the mesh thereof with a suitable doctor blade, not shown, positioned to remove excess contacts from the mesh. A roller, not shown, may be employed to seat the contacts within the mesh and a curing station 52 employed to cure the adhesive to produce a finished connector sheet 30 drawn therefrom. Controls, not shown, would be employed to regulate the method. Connector sheets 30 of discrete area would be formed by cutting the sheet 30 shown in FIG. 6 into appropriate lengths.

In practice, contacts formed of solid material would be used in applications requiring high normal forces and low contact resistance. Contacts of gel or metal springs would be employed in other appropriate applications of lower force and higher allowed electrical resistance and less planar tolerance.

I claim:

1. In a method of manufacture of an electrical connector of a type used to interconnect conductive paths to circuit paths, the steps comprising:
   a. providing a sheet of flexible insulating material including an ordered mesh extending thereover,
   b. coating said sheet with adhesive to deposit adhesive in the said mesh,
   c. applying discrete contacts of a size to fit and fill the said mesh of the said sheet,
   d. curing said adhesive to hold said contacts within the said mesh of said sheet to form an ordered array of contacts in said sheet.

2. The method of claim 1 wherein the step of applying the discrete contacts includes the application step of flooding the sheet with contacts and vibrating said web to locate discrete contacts proximate to said mesh and there is included the further step of forcing said contacts into said mesh while removing the excess of said contacts from said sheet.

3. The method of claim 1 wherein there is an additional step of cutting the said sheet into discrete areas related to areas to be interconnected following the curing step.

4. An electrical connector assembly for intermating the conductive pads of a component to the conductive pads of a circuit including housing means operable to drive the component toward the said circuit, a sheet connector comprised of a web of flexible insulating material formed of insulating strands joined together to define a mesh coextensive with the pads of the component and circuit, said mesh defining a plurality of cavities, each of an area substantially less than the area of the pads of the component and circuit, conductive contacts disposed in the cavities of the mesh of a thickness relative to the thickness of the web to engage and interconnect the pads of a component to the pads of a circuit responsive to the component and circuit being driven relatively together by the said connecting means.

5. An electrical connector assembly for intermating the conductive pads of a component to the conductive pads of a circuit, including housing means operable to drive the component toward the said circuit, a sheet connector comprised of a web of flexible insulating material formed of strands woven into a woof and weave defining a mesh coextensive with the pads of the component and circuit, said mesh defining a plurality of cavities each of an area substantially less than the area of the pads of component and circuit, conductive contacts disposed in the cavities of the mesh of a thickness relative to the thickness of the web to engage and interconnect the pads of a component to the pads of a circuit responsive to the component and circuit being driven relatively together by the said housing means.

6. An electrical connector of a type adapted to be positioned between the conductive surfaces of at least two elements to electrically interconnect such surfaces, said elements including a sheet of flexible insulating material comprised of a web of insulating strands joined together having a mesh of cavities disposed over the area thereof with the said cavities on substantially constant center line spacings to define a multiplicity of cavities for each contact area of the said elements, a contact disposed in each mesh cavity of a thickness to engage and interconnect the said areas upon said elements being driven together against said sheet whereby a plurality of contacts engage the said areas.

7. An electrical connector of a type adapted to be positioned between the conductive surfaces of at least two elements to electrically interconnect such surfaces including a sheet of flexible insulating material having a web of insulating strands joined together formed of the woof and weave of said strands to define and mesh of cavities disposed over the area thereof with the said cavities on substantially constant center line spacings to define a multiplicity of cavities for each contact of the said elements, a contact disposed in each mesh cavity of a thickness to engage and interconnect the said areas upon said elements being driven together against said sheet whereby a plurality of contacts engage the said areas.

* * * * *